US010573697B2

(12) United States Patent
Sasabayashi

(10) Patent No.: US 10,573,697 B2
(45) Date of Patent: Feb. 25, 2020

(54) ORGANIC EL DISPLAY DEVICE

(71) Applicant: Japan Display Inc., Minato-ku (JP)

(72) Inventor: Takashi Sasabayashi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 77 days.

(21) Appl. No.: 15/730,113

(22) Filed: Oct. 11, 2017

(65) Prior Publication Data

US 2018/0108715 A1 Apr. 19, 2018

(30) Foreign Application Priority Data

Oct. 13, 2016 (JP) ................................ 2016-201515

(51) Int. Cl.
*H01L 27/32* (2006.01)

(52) U.S. Cl.
CPC ........ *H01L 27/3237* (2013.01); *H01L 27/326* (2013.01); *H01L 27/3246* (2013.01)

(58) Field of Classification Search
CPC ...................... H01L 27/3237; H01L 27/3246; H01L 27/326
See application file for complete search history.

(56) References Cited

U.S. PATENT DOCUMENTS

2011/0198623 A1* 8/2011 Matsushima ....... H01L 27/3246 257/88
2012/0326201 A1* 12/2012 Ohnuma ............ H01L 51/0085 257/99
2015/0060820 A1 3/2015 Takagi et al.
2015/0060832 A1* 3/2015 Ito ...................... H01L 51/5225 257/40
2015/0144906 A1* 5/2015 Ichikawa ........... H01L 51/5228 257/40

FOREIGN PATENT DOCUMENTS

JP 2015-50011 3/2015

* cited by examiner

*Primary Examiner* — Marcos D. Pizarro
*Assistant Examiner* — Sue Tang
(74) *Attorney, Agent, or Firm* — Oblon, McClelland, Maier & Neustadt, L.L.P.

(57) ABSTRACT

An organic EL display device includes a bank having an inclined surface, a first electrode formed on the inclined surface, an organic film including a light emitting layer and directly contacting the first electrode on the inclined surface, and a second electrode directly contacting the organic film on the inclined surface.

6 Claims, 9 Drawing Sheets

ORGANIC EL DISPLAY DEVICE

CROSS-REFERENCE TO RELATED APPLICATION

The present application claims priority from Japanese application JP2016-201515 filed on Oct. 13, 2016, the content of which is hereby incorporated by reference into this application.

BACKGROUND OF THE INVENTION

1. Field of the Invention

The present invention relates to an organic electro-luminescence (EL) display device.

2. Description of the Related Art

Typically, an organic EL display device includes a flat EL layer on a substrate and is configured such that the angular distribution of emitted light intensity thereof exhibits a peak at an angle corresponding to the front side (see Japanese Patent Laid-open Publication No. 2015-50011).

SUMMARY OF THE INVENTION

In some usages, the angular distribution of emitted light intensity may desirably exhibit a peak at an angle corresponding to an oblique direction rather than the front side.

The present invention has been conceived in view of the above, and it is an object of the present invention to provide an organic EL display device having an angular distribution of emitted light intensity that exhibits a peak at an angle corresponding to an oblique direction.

An organic EL display device includes a bank having an inclined surface, a first electrode formed on the inclined surface, an organic film including a light emitting layer and directly contacting the first electrode on the inclined surface, and a second electrode directly contacting the organic film on the inclined surface.

DETAILED DESCRIPTION OF THE INVENTION

Figure 1:
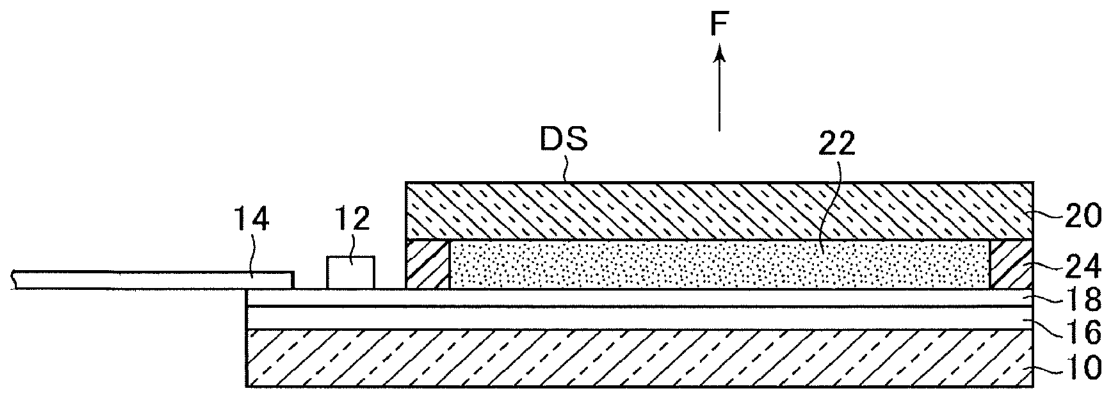
FIG. 1 is a cross sectional view of an organic EL display device according to an embodiment of the present invention.

The following describes respective embodiments of the present invention while referring to the drawings. The disclosure is a mere example, and modifications which a person skilled in the art can readily perceive without departing from the gist of the present invention are included in the range of the present invention. The drawings may illustrate the widths, thicknesses, shapes or the like of respective members more schematically as compared with those in embodiments in order to make clearer the explanation. Those illustrated are mere examples, and should not limit interpretation of the present invention in any way. In the specification and respective drawings, members same as those having already described with reference to the drawings already referred to are given the same reference numerals, and detailed description thereof may be omitted.

FIG. 1 is a cross sectional view of an organic electro-luminescence (EL) display device according to an embodiment of the present invention. An organic EL display device includes a first substrate 10. The first substrate 10 has an integrated circuit chip 12 thereon for driving a pixel. The first substrate 10 is connected to a flexible wiring board 14 for electrical connection to outside. The first substrate 10 has a circuit layer 16 thereon including a thin film transistor (not shown), a wire, and an insulating layer. The circuit layer 16 has an element layer 18 thereon. Details of the element layer 18 will be described later.

The organic EL display device includes a second substrate 20. The second substrate 20 is disposed spaced apart from and opposed to the first substrate 10. A filling agent 22 is held between the first substrate 10 and the second substrate 20. The filling agent 22 is surrounded, and thereby sealed, by a sealing member 24. The second substrate 20 is omissible.

Below, assume that the direction of the second substrate 20 viewed from the first substrate 10 (the direction indicated by the arrow F in FIG. 1) is defined as the upward direction. In this embodiment, the top surface of the second substrate 20 is defined as a display surface DS, and the upper outside of the display surface DS is defined as the front side of the display surface DS. Extraction of light to outside means arrival of light having passed through the display surface DS above the display surface DS.

The element layer 18 of the first substrate 10 has a plurality of pixels arranged thereon in a matrix. In this embodiment, two types of pixels A and B to be described below are arranged on the element layer 18 of the first substrate 10.

Figure 2A:
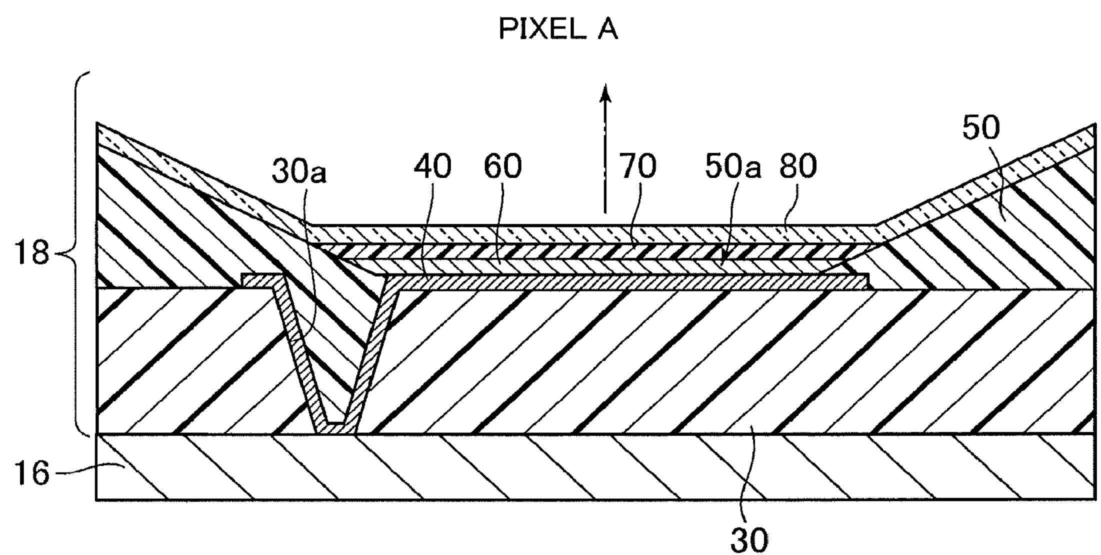
FIG. 2A illustrates an example of a laminated structure of a pixel A.
Figure 2B:
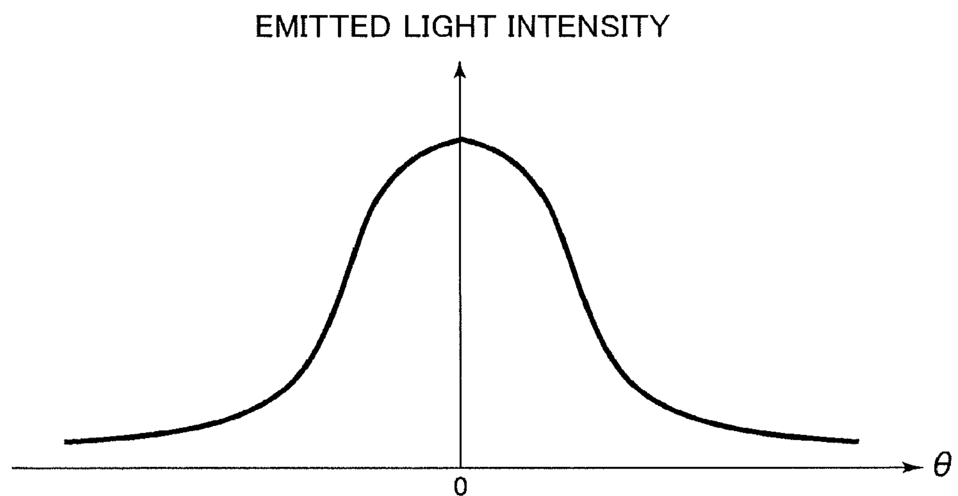
FIG. 2B illustrates the angular distribution of emitted light intensity of the pixel A.

FIG. 2A is a cross sectional view of an example of a laminated structure of a pixel A. FIG. 2B illustrates the angular distribution of the emitted light intensity of the pixel A. The abscissa represents the angle θ relative to the display surface DS, in which θ=0 corresponds to the front side. The ordinate represents the emitted light intensity. The pixel A is an example of a second pixel.

The circuit layer 16 is covered by a planarization film 30. The planarization film 30 has a contact electrode 40 (simply referred to as an electrode as well) thereon. The planarization film 30 further has a through hole 30*a* therein for connecting the contact electrode 40 to the thin film transistor of the circuit layer 16. The planarization film 30 is made of organic insulating material, such as acrylic resin, for example, and has a flat top surface. The contact electrode 40 is an example of a lower layer electrode, and is made of transparent conductive material, such as indium zinc oxide (IZO) or indium tin oxide (ITO), for example.

The planarization film 30 and the contact electrode 40 are covered by a bank 50. The bank 50 has an opening 50*a* therein, where the contact electrode 40 is exposed. The bank 50, referred to also as a pixel separation film or a rib, is made of organic material, such as acrylic resin, for example.

On the contact electrode 40 exposed in the opening 50*a* of the bank 50, a lower electrode 60 and an organic film 70 are laminated in this sequence. The lower electrode 60 is an anode, for example, and made of metal such as aluminum, silver, copper, nickel, or titanium, or has a laminated structure including metal and transparent conductive material. The lower electrode 60 may have a laminated structure including three layers including indium tin oxide (ITO), silver, and indium tin oxide (ITO). The organic film 70 includes, sequentially from the lower electrode 60, a hole injection layer, a hole transport layer, a light emitting layer, an electron transport layer, and an electron injection layer. The laminated structure of the organic film 70 is not limited to the above mentioned, and the organic film 70 may have any other laminated structure as long as at least a light emitting layer is included. The color of light emitted from the light emitting layer is not limited to white, and may be red, green, or blue, for example.

The bank 50 and the organic film 70 are covered by an upper electrode 80. The upper electrode 80 is a cathode, for example, and is made of transparent conductive material, such as indium zinc oxide (IZO) or indium tin oxide (ITO), for example, or semi-transparent conductive material including alloy (MgAg) of magnesium and silver, for example. The upper electrode 80 is covered by a sealing film (not shown). The sealing film is made of inorganic insulating material, such as silicon oxide or silicon nitride, for example, and in contact with the filling agent 22 and the sealing member 24 (see FIG. 1).

The pixel A includes the organic film 70 including a light emitting layer and having a flat surface. A "flat surface" here means a surface parallel to the front surfaces of the substrates 10, 20 or the display surface DS. The top surface of the planarization film 30 is a flat surface, and the top surface of the contact electrode 40 formed on the top surface of the planarization film 30 is also a flat surface. The contact electrode 40 has the lower electrode 60, the organic film 70, and the upper electrode 80 laminated in this sequence on the top surface thereof. Consequently, the organic film 70 is parallel to the front surfaces of the substrates 10, 20 and the display surface DS.

Light from the organic film 70 having a flat surface is emitted mainly toward the front side, passing through the upper electrode 80 before being extracted to outside. Consequently, the resultant angular distribution of the emitted light intensity exhibits a peak at an angle corresponding to the front side, as illustrated in FIG. 2B.

Figure 3A:
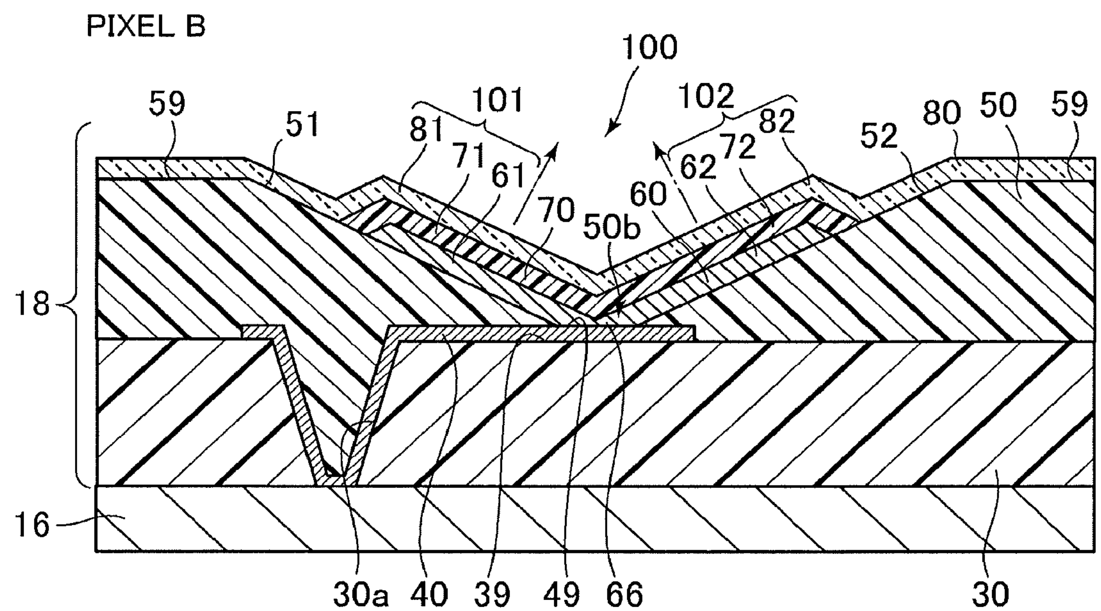
FIG. 3A illustrates an example of a laminated structure of a pixel B.
Figure 3B:
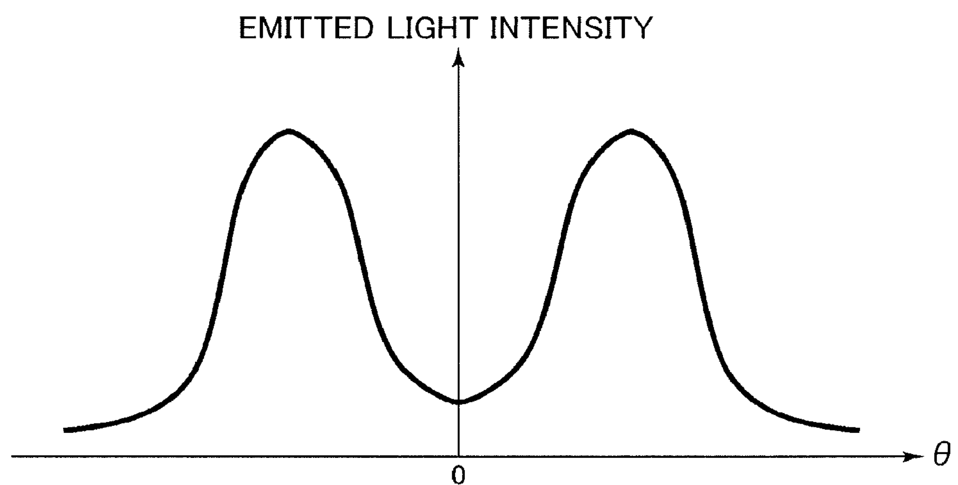
FIG. 3B illustrates the angular distribution of emitted light intensity of the pixel B.

FIG. 3A is a cross sectional view of an example of the laminated structure of the pixel B. FIG. 3B illustrates the angular distribution of the emitted light intensity of the pixel B, specifically illustrating emitted light intensity with the angle $\theta$, observed on the cross section in FIG. 3A, changed. The pixel B is an example of a first pixel.

The pixel B includes inclined surfaces 51, 52 formed on the bank 50. An "inclined surface" here means a surface that is inclined relative to a flat surface (that is, a surface parallel to the front surfaces of the substrates 10, 20 or that of the display surface DS). The two inclined surfaces 51, 52 have different orientations. In this embodiment, two inclined surfaces 51, 52 are arranged so as to together define a valley shape. That is, the two inclined surfaces 51, 52 are inclined such that the respective normals thereof approach each other. The inclined surfaces 51, 52 define, by their lower ends, an opening 50*b* therebetween, where the contact electrode 40 is exposed. The bank 50 having the inclined surfaces 51, 52 can be formed through patterning or the like with a multi-gradation mask, for example.

The pixel B has a light emitting unit 100 on the inclined surfaces 51, 52 of the bank 50. That is, each inclined surface 51, 52 has the lower electrode 60 thereon, which is covered by the organic film 70, which is covered by the upper electrode 80. The upper electrode 80 covers also the top surface 59 of the bank 50. In this embodiment, the light emitting unit 100 including the lower electrode 60, the organic film 70, and the upper electrode 80 is bent along the inclined surfaces 51, 52 defining the valley shape. The light emitting unit 100 includes a first portion 101 disposed on the first inclined surface 51 and a second portion 102 disposed on the second inclined surface 52. The first portion 101 includes first portions 61, 71, 81 that are parts of the lower electrode 60, organic film 70, and upper electrode 80, respectively, disposed on the first inclined surface 51, while the second portion 102 includes second portions 62, 72, 82 disposed on the second inclined surface 52.

The lower ends of the first portion 101 and second portion 102 of the light emitting unit 100 are continuous with each other, and connected to the contact electrode 40 through the opening 50*b* formed in the bank 50. Specifically, in the opening 50*b* between the two inclined surfaces 51, 52 of the bank 50, the top surface 49 of the contact electrode 40 on the top surface 39 of the planarization film 30 is exposed and adjacent to the two inclined surfaces 51, 52. The lower end portion of the lower electrode 60 that is bent into a valley shape makes a connection portion 66 connected to the top surface 49 of the contact electrode 40 exposed in the opening 50*b*.

Light from the light emitting unit 100 formed on the inclined surfaces 51, 52 as described above is emitted mainly in oblique directions perpendicular to the respective inclined surfaces 51, 52 before being extracted to outside. Specifically, the first portion 101 of the light emitting unit 100 on the first inclined surface 51 emits light mainly in an oblique direction perpendicular to the first inclined surface 51, while the second portion 102 on the second inclined surface 52 emits light mainly in an oblique direction perpendicular to the second inclined surface 52. Consequently, the resultant angular distribution of emitted light intensity exhibits two peaks at respective angles corresponding to the two oblique directions with the direction corresponding to the front side in-between, as illustrated in FIG. 3B. That is, the direction with the largest intensity of light from the pixel B differs from that from the pixel A.

Here, note that, in using a portable display terminal in a public place, there is a risk that displayed content will be peeped by other people. To prevent peeping by other people, a viewing angle control film may be attached on the display. This type of film, however, premises a use under a condition in which the film remains attached on a display, and cannot be attached or removed depending on a situation. Furthermore, a film attached increases the thickness of the entire terminal.

In view of the above, in this embodiment, use of the pixel A having an angular distribution of emitted light intensity that exhibits a peak at an angle corresponding to the front side and the pixel B having an angular distribution of emitted light intensity that exhibits a peak at an angle corresponding to an oblique direction, as described above, allows switching between a normal display mode and a peeping prevention mode.

Figure 4A:
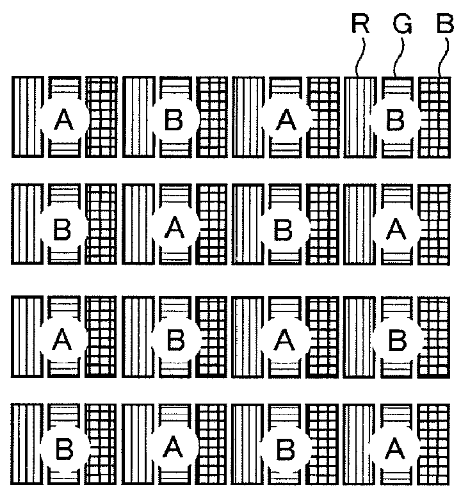
FIGS. 4A, 4B and 4C illustrate examples of an array of the pixels A and B.
Figure 4B:
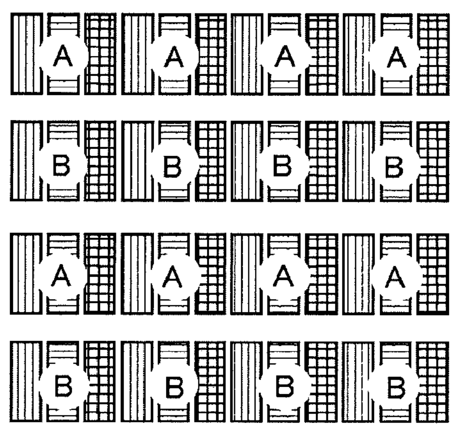
Figure 4C:
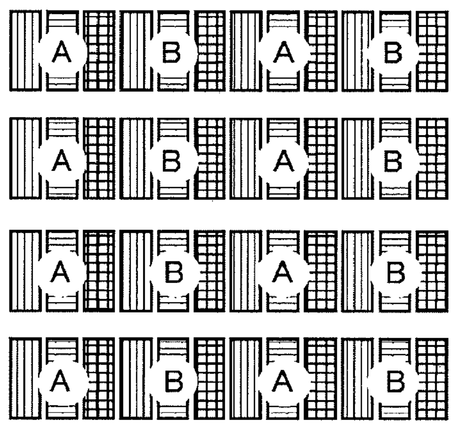

As illustrated in FIGS. 4A, 4B and 4C, the pixel A and the pixel B are arranged adjacent to each other in an organic EL display device. For example, the pixel A and the pixel B may be alternately arranged for every single pixel in both the row and column directions, as illustrated in FIG. 4A, or in either one of the row and column directions, as illustrated in FIGS. 4B and 4C. Alternatively, the pixels A and the pixels B may be arranged differently from the above described.

In a normal display mode, an organic EL display device displays the same image with the pixels A and with the pixels B, respectively. That is, the integrated circuit chip 12 (see FIG. 1) functioning as a display control device drives the pixels A and the pixels B, respectively, in response to a signal for the same image. With the above, as the pixels A and the pixels B respectively display the same image, light mainly from the pixels A reaches a position on the front side of the display surface DS, and light mainly from the pixels B reaches a position in an oblique direction. Consequently, it is possible to implement stronger emitted light intensity in a wider angular range, as compared with a case of the pixels A alone. This can improve viewing angle characteristics.

Figure 5:
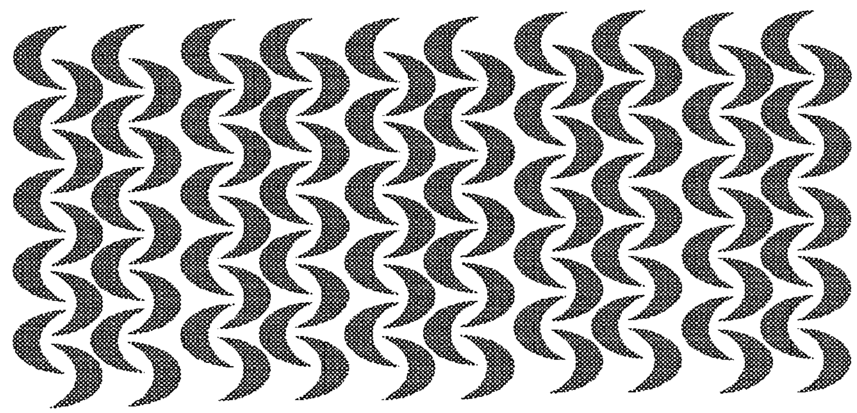
FIG. 5 illustrates an example of a camouflage image.

In a peeping prevention mode, on the other hand, an organic EL display device displays different images with the pixels A and with the pixels B, respectively. That is, the integrated circuit chip 12 functioning as a display control device drives the pixels A and the pixels B, respectively, in response to different signals for different images. Then, the pixels A display a normal image, such as is displayed in the normal display mode, while the pixels B display a camouflage image, such as is illustrated in FIG. 5, for example. With the above, light mainly from the pixels A reaches a position on the front side of the display surface DS, and light mainly from the pixels B reaches a position in an oblique direction. Consequently, a user seeing the display surface DS from the front side thereof sees the normal image, and a user obliquely peeping the display surface DS sees the camouflage image. This can prevent an image from being peeped.

In this embodiment, the normal mode and the peeping prevention mode are switchable. This allows a user to prevent an image from being obliquely peeped by applying the peeping prevention mode when necessary, while enjoying a normal image superior in viewing angle characteristics by applying the normal display mode when peeping prevention is unnecessary.

As illustrated in FIGS. 4 A, 4B and 4C, each of the pixel A and the pixel B includes a plurality of sub-pixels R, G, B. In this embodiment, the sub-pixels R, G, B for three colors, namely, red, green, and blue, for example, together constitute one pixel. The colors of the sub-pixels R, G, B may be any other colors besides the above-mentioned colors. The colors of the sub-pixels R, G, B may be implemented by the color of light from the light emitting layer in the organic film 70 or by a color filter provided to the second substrate 20 (see FIG. 1).

Each of the sub-pixels R, G, B of the pixel B has a structure including the light emitting unit 100 on the inclined surfaces 51, 52, such as is illustrated in FIGS. 3A and 3B. In the case where a color filter is provided to the second substrate 20, the color filter of each of the sub-pixels R, G, B of the pixel B may be offset from the front side, depending on the light emitting direction.

Figure 6A:
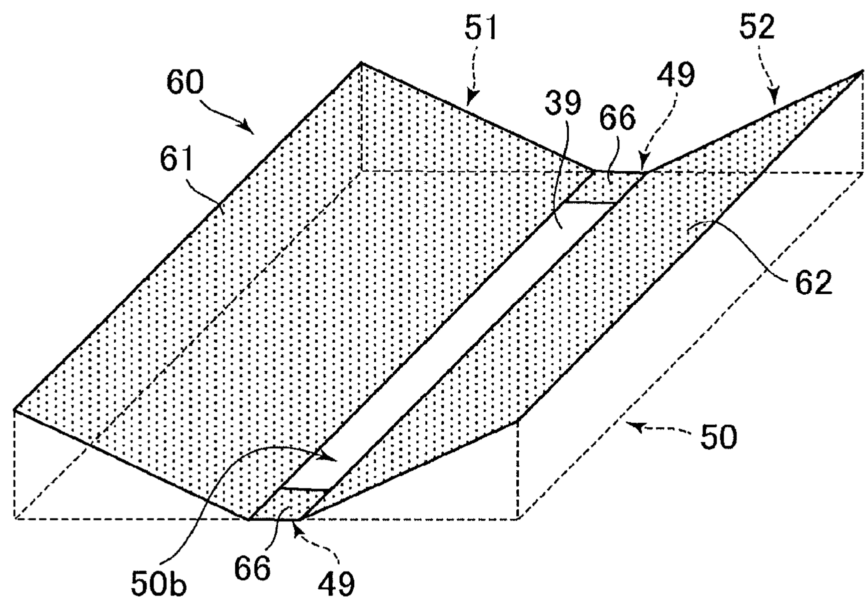
FIGS. 6A and 6B are a perspective view of examples of a structure of a bank and a lower electrode.
Figure 6B:
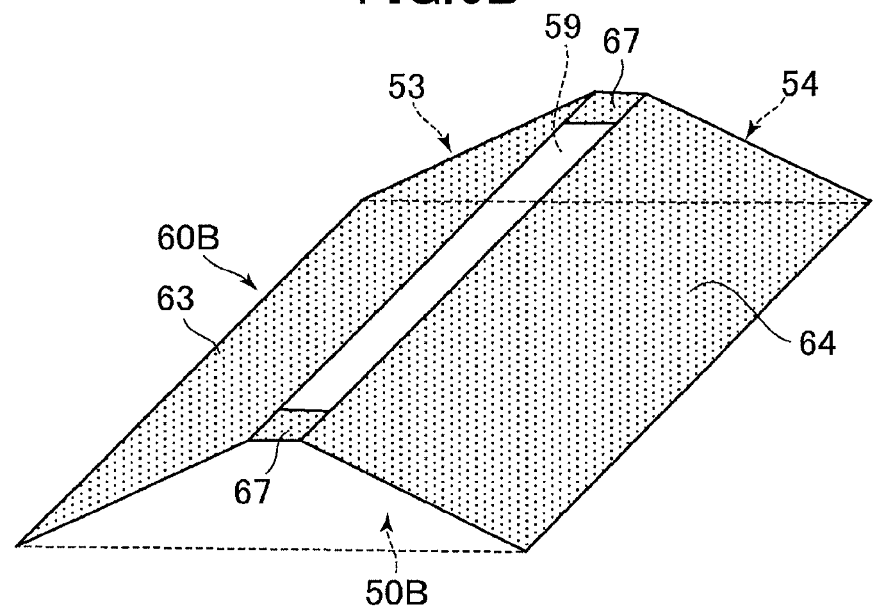

FIGS. 6A and 6B and FIGS. 7 A and 7B are perspective views of an example of a structure of the bank 50 and the lower electrode 60.

In the example in FIG. 6A, the bank 50 has two inclined surfaces 51, 52 that are arranged so as to together define a valley shape, similar to FIG. 3A. The lower electrode 60 is disposed on each of the inclined surfaces 51, 52. The inclined surfaces 51, 52 define, by their lower ends, a strip-shaped opening 50*b* extending in a direction, of the in-plane directions, perpendicular to the inclination directions of the inclined surfaces 51, 52. In the opening 50*b*, the top surface 39 of the planarization film 30 or the top surface 49 of the contact electrode 40 is exposed and adjacent to the inclined surfaces 51, 52. The top surface 49 of the contact electrode 40 exposed in the opening 50*b* is physically and electrically connected to the connection portion 66 of the lower electrode 60. The first portion 61 of the lower electrode 60 disposed on the first inclined surface 51 is connected to the second portion 62 of the same disposed on the second inclined surface 52 via the connection portion 66.

The width of the connection portion 66 in the extending direction of the opening 50*b* (that is, the direction along the boundary between the inclined surfaces 51, 52 and the top surfaces 39, 49) is shorter than those of the portions 61, 62 on the inclined surfaces 51, 52. In the illustrated example, only the both end portions of the opening 50*b* in the extending direction are covered by the connection portion 66, while the remaining portion thereof is left uncovered by the lower electrode 60. The above described connection portion 66 that is short in the extending direction of the opening 50*b* can reduce the amount of light emitted from the portion of the light emitting layer 100 that is disposed on the flat surface. This can secure a sufficient amount of light proceeding in an oblique direction, while reducing the amount of light proceeding toward the front side. Consequently, when the pixels A and B display different images, it is possible to prevent the two images from appearing mixed to a viewer seeing from the front side.

The width of the connection portion 66 in a direction perpendicular to the extending direction of the opening 50*b* (that is, the inclination direction of the inclined surface 51, 52) as well is shorter than those of the portions 61, 62 on the respective inclined surfaces 51, 52. This as well can secure a sufficient amount of light proceeding in an oblique direction, while reducing the amount of light toward the front side.

The valley structure defined by the two inclined surfaces 51, 52 of the bank 50 may be formed across a plurality of pixels arranged in the direction in which the valley structure extends. This can simplify the shape of the bank 50 so that a larger number of pixels can be accumulated.

In the example in FIG. 6B, a bank 50B has two inclined surfaces 53, 54 arranged so as to together define a mountain shape. The two inclined surfaces 53, 54 are inclined such that their normals depart from each other. A lower electrode 60B is formed on each of the inclined surfaces 53, 54. The lower electrode 60B is bent so as to define a mountain shape along the inclined surfaces 53, 54 that define a mountain shape. This structure as well causes light to be emitted mainly in respective directions perpendicular to the inclined surfaces 53, 54. Consequently, the resultant angular distribution of the emitted light intensity exhibits peaks at two respective angles corresponding to the two oblique directions with the direction corresponding to the front side in-between.

A strip-shaped top surface 59 is left between the inclined surfaces 53, 54, extending in a direction, of the in-plane directions, perpendicular to the inclination directions of the inclined surfaces 53, 54 and being adjacent to the inclined surfaces 53, 54. The top surface 59 of the bank 50B has a through hole (not shown) therein, where the contact electrode 40 (see FIG. 3A) is exposed. As a connection portion

67 of the lower electrode 60B is formed in the through hole, the contact electrode 40 is physically and electrically connected to the lower electrode 60B. The first portion 63 of the lower electrode 60B disposed on the first inclined surface 53 is connected to the second portion 64 disposed on the second inclined surface 54 via the connection portion 67.

The width of the connection portion 67 in the extending direction of the top surface 59 (that is, the direction along the boundary between the inclined surfaces 53, 54 and the top surface 59) is shorter than those of the respective portions 63, 64 disposed on the inclined surfaces 53, 54. In the illustrated example, only the both end portions of the top surface 59 in the extending direction are covered by the connection portion 67, and the remaining portion thereof is uncovered by the lower electrode 60B. The connection portion 67 having a short width in the extending direction of the top surface 59 as described above can reduce the amount of light emitted from the portion of the light emitting unit 100 that is disposed on the flat surface. That is, it is possible to secure a sufficient amount of light proceeding in an oblique direction, while reducing the amount of light proceeding toward the front side.

The width of the connection portion 67 in a direction perpendicular to the extending direction of the top surface 59 (that is, the inclination direction of the inclined surfaces 53, 54) as well is shorter than those of the portions 63, 64 disposed on the respective inclined surfaces 53, 54. This as well can secure a sufficient amount of light proceeding in an oblique direction, while reducing the amount of light proceeding toward the front side.

Figure 7A:
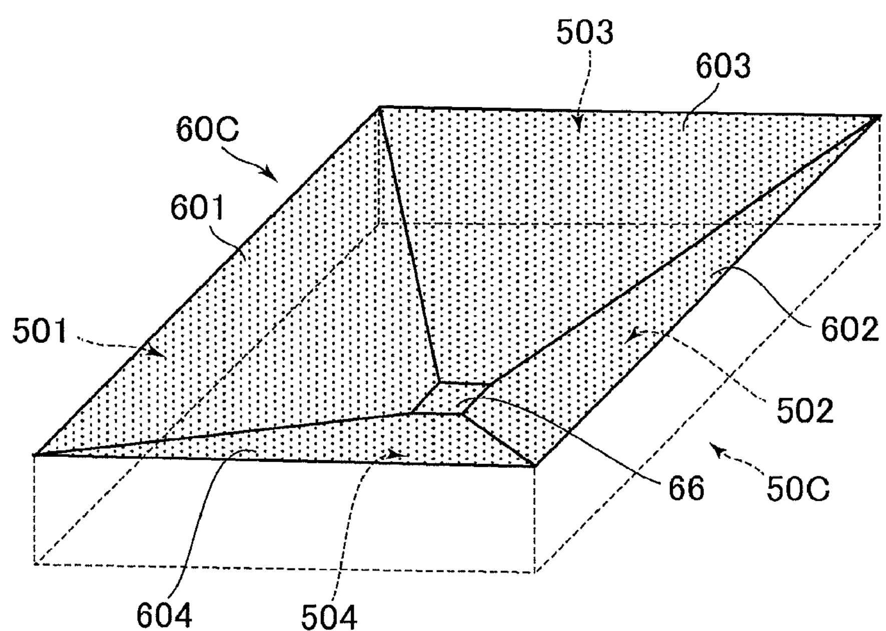
FIGS. 7A and 7B are a perspective view of examples of a structure of a bank and a lower electrode.

In the example in FIG. 7A, a concave having a substantially quadrangular pyramid shape recessed downward is formed in the upper portion of a bank 50C. The bank 50*c* has four inclined surfaces 501 to 504 surrounding the central portion of the bank 50*c*. Each of the inclined surfaces 501 to 504 has a substantially triangular shape of which width becomes narrower as it goes downward. A lower electrode 60C is formed on each of the inclined surfaces 501 to 504. This structure causes light to be emitted mainly in a direction perpendicular to each of the inclined surfaces 501 to 504. Consequently, the resultant angular distribution of the emitted light intensity exhibits peaks at angles corresponding to the four respective oblique directions surrounding the direction corresponding to the front side.

The lower electrode 60C includes a first portion 601 disposed on the first inclined surface 501, a second portion 602 disposed on the second inclined surface 502, a third portion 603 disposed on the third inclined surface 503, and a fourth portion 604 disposed on the fourth inclined surface 504, in which the respective adjacent portions are connected to each other. The lower electrode 60C has a rectangular connection portion 66 surrounded by, and connected to, the portions 601 to 604 on the respective inclined surfaces 501 to 504.

The inclined surfaces 501 to 504 of the bank 500 define, by the lower ends thereof, a rectangular opening (not shown), which are surrounded by the inclined surfaces 501 to 504. The opening is covered by the connection portion 66 of the lower electrode 60C. In the opening, the top surface 49 (see FIG. 3A) of the contact electrode 40 is exposed, so that the contact electrode 40 is physically and electrically connected to the connection portion 66 of the lower electrode 60C through the opening.

The width of the connection portion 66 of the lower electrode 60C in any of the in-plane directions is shorter than those of the respective portions 601 to 604 on the inclined surfaces 501 to 504. In the example illustrated, the connection portion 66 is formed only in a small area at the center of the lower electrode 60C. The small connection portion 66 as described above can reduce the amount of light emitted from the portion of the light emitting unit 100 disposed on a flat surface. This can secure a sufficient amount of light proceeding in an oblique direction, while reducing the amount of light proceeding toward the front side.

Figure 7B:
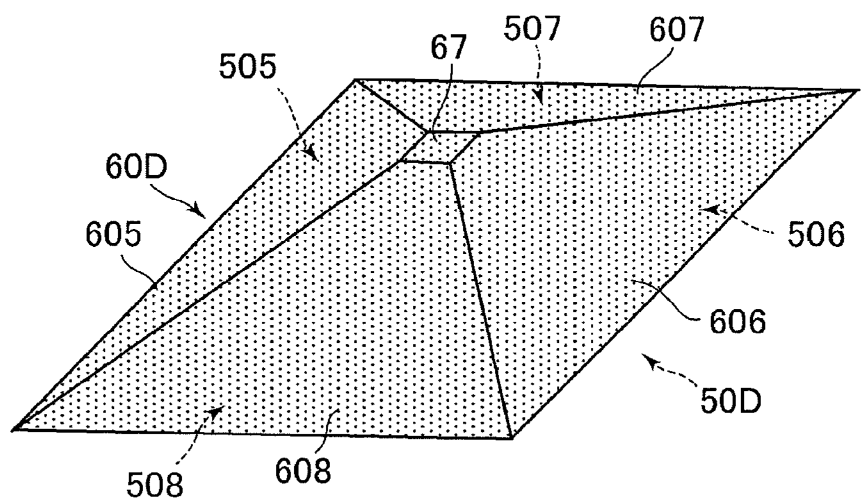

In the example in FIG. 7B, the bank 50D is formed in a substantially quadrangular pyramid shape projecting upward, and has four inclined surfaces 505 to 508 surrounding the central portion thereof. Each of the inclined surfaces 505 to 508 has a substantially triangular shape of which width becomes narrower as it goes upward. A lower electrode 60D is formed on each of the inclined surfaces 505 to 508. This structure as well causes light to be emitted mainly in a direction perpendicular to each of the inclined surfaces 505 to 508. Consequently, the resultant angular distribution of emitted light intensity exhibits peaks at angles corresponding to the four respective oblique directions surrounding the direction corresponding to the front side.

The lower electrode 60D includes a first portion 605 disposed on the first inclined surface 505, a second portion 606 disposed on the second inclined surface 506, a third portion 607 disposed on the third inclined surface 507, and a fourth portion 608 disposed on the fourth slope surface 508, in which the respective adjacent portions are connected to each other. The lower electrode 60D has a rectangular connection portion 67 surrounded by, and connected to, the portions 605 to 608 on the respective inclined surfaces 505 to 508.

The bank 50D has a top surface (not shown) surrounded by the inclined surfaces 505 to 508. The top surface is covered by the connection portion 67 of the lower electrode 60D. The top surface has a through hole (not shown) therein, where the top surface 49 (see FIG. 3A) of the contact electrode 40 is exposed. As the connection portion 67 of the lower electrode 60D is disposed in the through hole, the lower electrode 60D is physically and electrically connected to the contact electrode 40.

The width of the connection portion 67 of the lower electrode 60D in any of the in-plane directions is shorter than those of the respective portions 605 to 608 on the inclined surfaces 505 to 508. In the example illustrated, the connection portion 67 is formed only in a small area at the center of the lower electrode 60D. The small connection portion 67 as described above can reduce the amount of light emitted from the portion of the light emitting unit 100 disposed on a flat surface. That is, this can secure a sufficient amount of light proceeding in an oblique direction, while reducing the amount of light proceeding toward the front side.

Figure 8A:
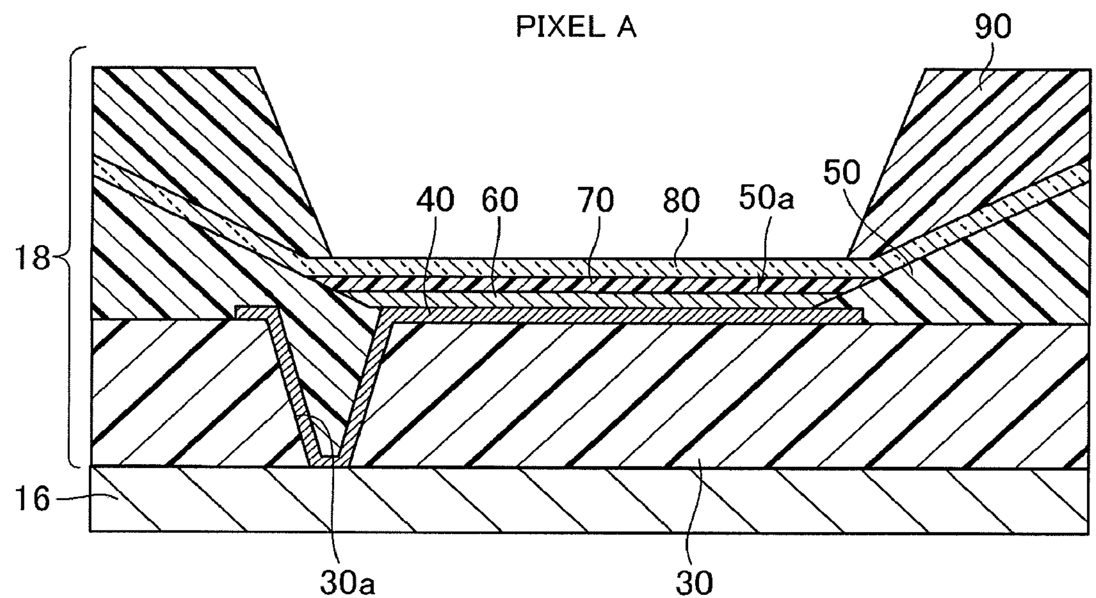
FIGS. 8A and 8B are a cross sectional view of examples of a laminated structure of a double bank.
Figure 8B:
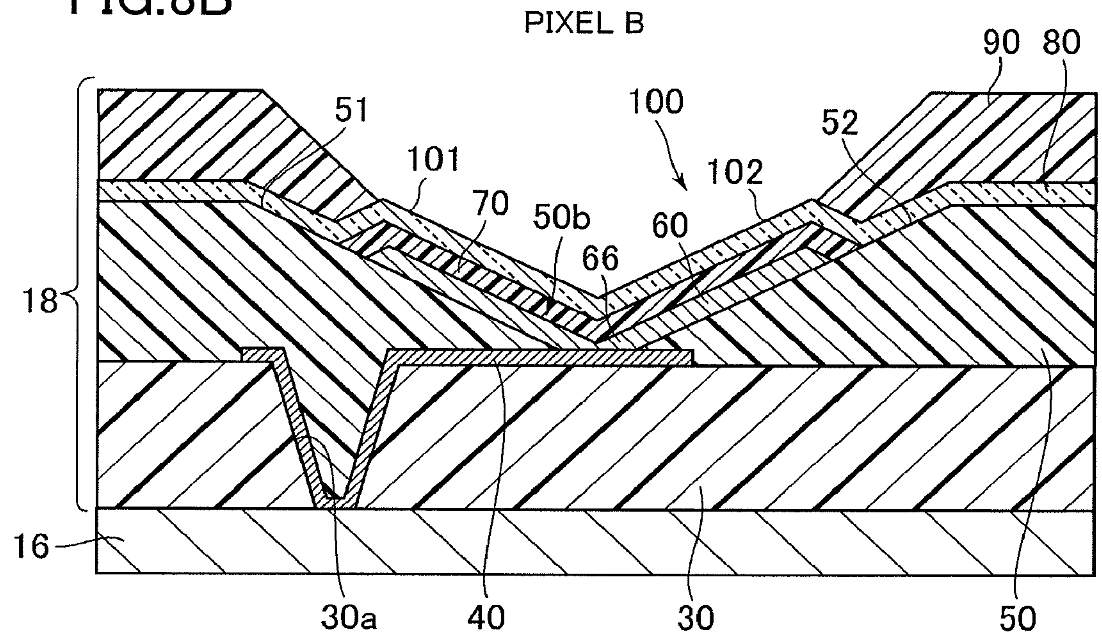

FIGS. 8A and 8B are a cross sectional view of examples of a laminated structure of a double bank. A structure same as one in the above described embodiments is given the same reference numeral, and detailed description thereof is not repeated. As illustrated in FIGS. 8A and 8B, a bank 90 may be additionally formed above the bank 50. In the example illustrated, the bank 90 covers the upper electrode 80, and has an opening therein corresponding to the light emitting area. The above described structure of the bank 90 is not an exclusive example. The bank 90 may be formed between the upper electrode 80 and the organic film 70 so as to cover the peripheral portion of the organic film 70, or between the organic film 70 and the lower electrode 60 so as to cover the peripheral portion of the lower electrode 60.

Figure 9A:
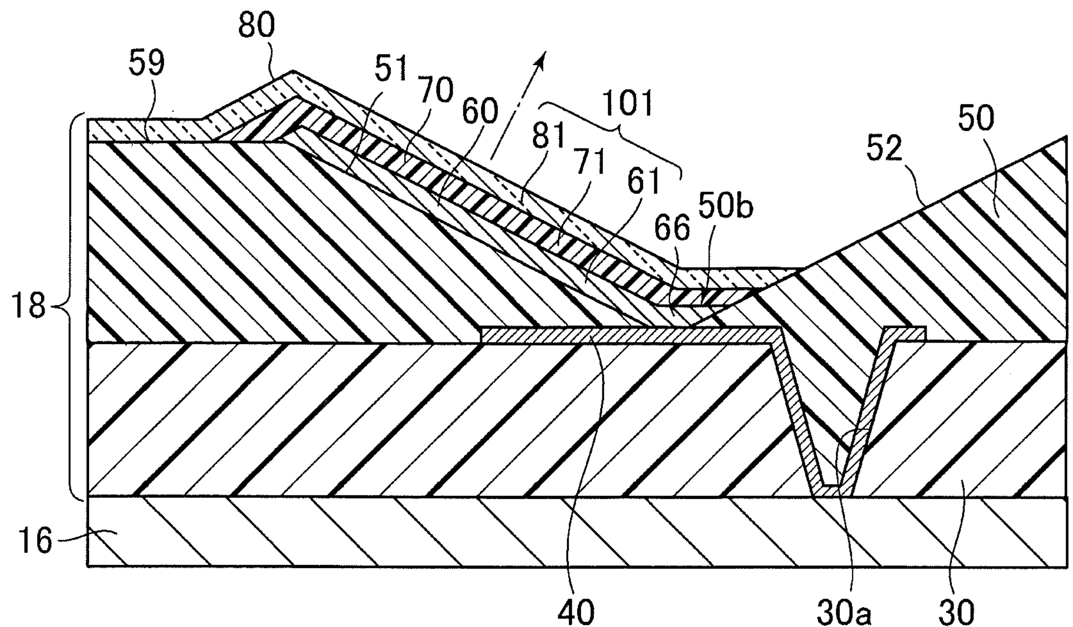
FIGS. 9A and 9B are a cross sectional view of examples of laminated structures of pixels B-1 and B-2.
Figure 9B:
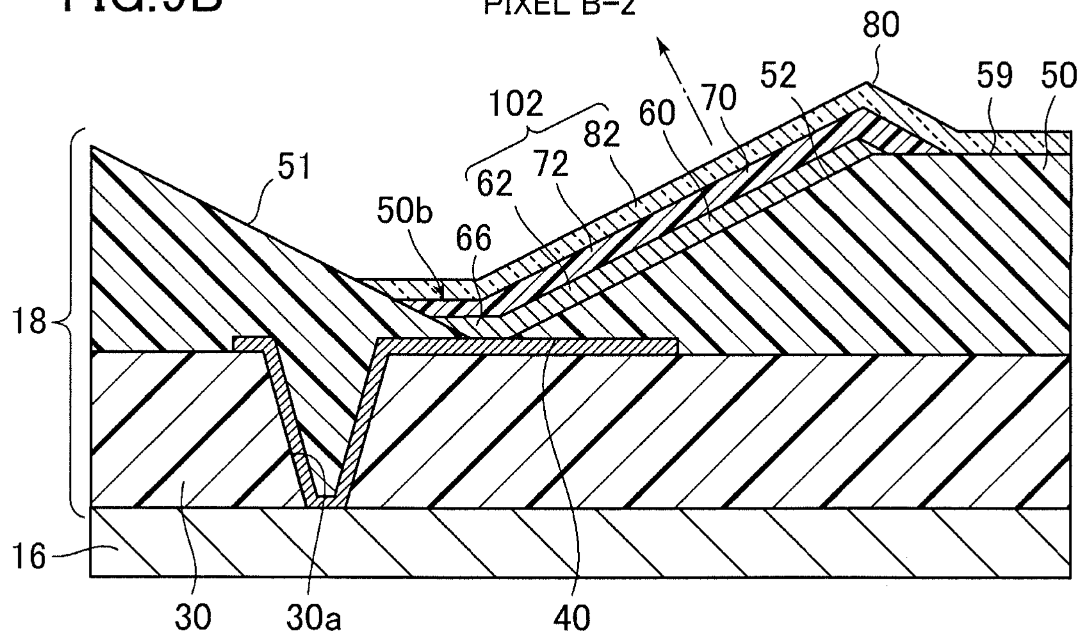

FIGS. 9A and 9B are a cross sectional view of examples of a laminated structure including pixels B-1 and B-2. A structure same as one in the above described embodiment is given the same reference numeral and detailed description thereof is not repeated. As illustrated in FIGS. 9A and 9B, two types of pixel B-1 and B-2 may be provided. In the pixel B-1, the lower electrode 60 is formed on the first inclined surface 51 of the bank 50. The lower electrode 60 is covered by the organic film 70, and the organic film 70 is covered by the upper electrode 80. That is, in each pixel B-1, the first portion 101 of the light emitting unit 100 illustrated in FIG. 3A is formed. Meanwhile, in each pixel B-2, the lower electrode 60 is formed on the second inclined surface 52 of the bank 50. The lower electrode 60 is covered by the organic film 70, and the organic film 70 is covered by the upper electrode 80. That is, in each pixel B-2, the second portion 102 of the light emitting unit 100 illustrated in FIG. 3A is formed.

With the above, in the pixel B-1, light from the first portion 101 on the first inclined surface 51 is emitted mainly in an oblique direction perpendicular to the first inclined surface 51. Consequently, the resultant angular distribution of the emitted light intensity exhibits a peak at an angle corresponding to an oblique direction on one side relative to the direction corresponding to the front side. Meanwhile, in the pixel B-2, light from the second portion 102 disposed on the second inclined surface 52 is emitted mainly in an oblique direction perpendicular to the second inclined surface 52. Consequently, the resultant angular distribution of the emitted light intensity exhibits a peak at an angle corresponding to an oblique direction on the other side relative to the direction corresponding to the front side.

The pixel A illustrated in FIG. 2A and the pixels B-1 and B-2 illustrated in FIGS. 9A and 9B are disposed adjacent to each other. For example, the pixels A, B-1, and B-2 may be alternately arranged in a predetermined sequence in at least either one of the row and column directions. Similar to the above described embodiments, in the peeping prevention mode, the pixels A display a normal image and the pixels B-1 and B-2 display a camouflage image. This can prevent an image from being obliquely peeped.

Alternatively, the pixels A and either one of the pixels B-1 and B-2 may display a normal display, and the other of the pixels B-1 and B-2 may display a camouflage image. When this modified example is employed in a vehicle-mounted display terminal, for example, a passenger on a rear seat who is located in front of the vehicle-mounted display terminal and a passenger on an oblique right or left passenger seat can see a normal image, while the driver on the other oblique side sees a camouflage image.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:

a substrate;

a planarization layer on the substrate;

a first organic light emitting element on the planarization layer;

a second organic light emitting element on the planarization layer; and a bank on the planarization layer, wherein the first organic light emitting element includes a first pixel electrode, an organic layer including light emitting layer on the first pixel electrode, and an oppose electrode on the organic layer, the second organic light emitting element includes a second pixel electrode, the organic layer on the second pixel electrode, and the oppose electrode on the organic layer, the first and second organic light emitting elements share the organic layer and the oppose electrode, the bank covers an upper surface of a part of the first pixel electrode, the bank has an opening, all formation region of the first organic light emitting element is arranged in the opening so that an upper surface of the first pixel electrode is in contact with a lower surface of the organic layer, an upper surface of the organic layer is in contact with a lower surface of the oppose electrode, and all region of the first pixel electrode in the all formation region has the same distance between the substrate and the first pixel electrode, the second pixel electrode is arranged on an inclined surface of the bank, and the second organic light emitting element is arranged on the inclined surface.

2. The organic EL display device according to claim 1, wherein the inclined surface includes a plurality of surfaces having different orientations, and the second organic light emitting element is arranged on the surfaces.

3. The organic EL display device according to claim 1, wherein the inclined surface includes two surfaces which are a valley shape, and the second organic light emitting element is formed on both of the two surfaces continuously.

4. The organic EL display device according to claim 1, wherein each of the first and second organic light emitting element is plural, and the first and second organic light emitting elements are arranged alternately in a first direction.

5. The organic EL display device according to claim 1, wherein the first and second organic light emitting elements are arranged alternately in a second direction that differs from the first direction.

6. The organic EL display device according to claim 5, further comprising:

the all formation region is in parallel with the substrate.

* * * * *